United States Patent [19]

McGuffin

[11] 3,943,379
[45] Mar. 9, 1976

[54] SYMMETRICAL ODD MODULUS FREQUENCY DIVIDER

[75] Inventor: William George McGuffin, Willingboro, N.J.

[73] Assignee: RCA Corporation, New York, N.Y.

[22] Filed: Oct. 29, 1974

[21] Appl. No.: 518,718

[52] U.S. Cl. ............................... 307/225 R; 328/39
[51] Int. Cl.² ........................................ H03K 23/00
[58] Field of Search ...... 307/220, 224, 225; 328/39, 328/46

[56] References Cited
UNITED STATES PATENTS

| 3,264,567 | 8/1966 | Prieto | 307/224 |
| 3,284,645 | 11/1966 | Eichelberger et al. | 307/225 |
| 3,341,693 | 9/1967 | Hurst | 328/46 |
| 3,439,278 | 4/1969 | Farrow | 307/225 |
| 3,523,252 | 8/1970 | Chikli-Pariente | 307/224 |
| 3,851,258 | 11/1974 | Freedman | 328/39 |

Primary Examiner—John Kominski
Attorney, Agent, or Firm—Edward J. Norton; Carl M. Wright

[57] ABSTRACT

Logic circuit for dividing an input frequency symmetrically by an odd number without producing spurious transients.

3 Claims, 3 Drawing Figures

SYMMETRICAL ODD MODULUS FREQUENCY DIVIDER

BACKGROUND OF THE INVENTION

1. Field of the Invention

This invention relates to logic circuits for symmetrically dividing an input frequency by an odd modulus.

2. History of the Prior Art

Frequency dividing circuits produce signals that are symmetrical or asymmetrical. The symmetrical signal is one which has a duty cycle of substantially 50%. In other words, for a sqaure wave or logic signal, the duration of the signal indicating a logical one is substantially equivalent to the duration of the signal designating a logical zero. Digital circuits are especially applicable to dividing circuits because of devices such as clocked flip-flops and gating circuits.

When the modulus of division is even, the output waveform is usually symmetrical. When the modulus of division is odd, however, the output signal is usually asymmetrical if the design objective is to keep the associated circuit as simple as possible.

In countdown circuits where the portion of the signal that is most important is the leading or falling edge of the signal, an asymmetrical signal will perform satisfactorily. Some applications, however, notably in communications work, require symmetrical waveforms which contain fewer harmonics in a given bandwidth. This increases the power in the frequency of interest, usually extracted by filters. A symmetrical square output waveform consists only of odd harmonics so that less complex filters are required. The output signal from some odd modulus dividers contain transients, which result from finite rise and fall times as well as inherent circuit delays.

This disclosure describes an invention which produces a substantially symmetrical output signal in an odd modulus divider circuit without producing the undesirable transients described above even when the frequency of the input signals is nearly equal to the reciprocal of the delay through various stages.

SUMMARY OF THE INVENTION

A logic circuit for symmetrically dividing input pulses by an odd modulus has several flip-flops and includes a complementor to furnish the complement of the input pulses. The input pulses control a first portion of the flip-flops and the complemented input pulses control the remaining flip-flops. The signals in the flip-flops only are gated to produce a substantially symmetrical output signal.

DETAILED DESCRIPTION OF THE PREFERRED EMBODIMENT

Figure 1:
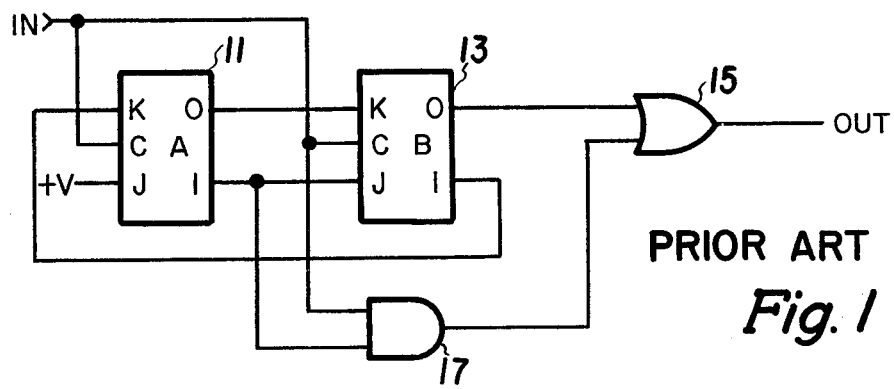
FIG. 1 is a logic diagram of a typical prior art circuit for producing a symmetrical output signal equivalent to an input frequency divided by three.

The prior art logic circuit of FIG. 1 includes two JK-type flip-flops 11 and 13. The contents of the A flip-flop 11 are shifted by each input signal to the B flip-flop 13. The J-input signal to the A flip-flop 11 is a constant logical one so that each input signal tends to set the A flip-flop 11 unless the B flip-flop 13 is set. When the output signal from the B flip-flop 13 produces an input signal to the K-input terminal of the A flip-flop 11, the A flip-flop is triggered to the opposite state by each input pulse. (For a detailed description of the operation of various types of flip-flops, refer to U.S. Pat. No. 3,588,545.)

An OR gate 15 produces an output signal when a zero is stored in the B register 13 or during an input signal pulse via an AND gate 17 when the A flip-flop 11 is set.

The circuit of FIG. 1 produces a substantially symmetrical output waveform which is one-third the frequency of the input waveform. The sequence of setting and resetting the A and B flip-flops is such that the A flip-flop and B flip-flop are set for two cycles of the input pulse and reset for one, but the cycle during which both are reset is not the same. When both the A flip-flop 11 and the B flip-flop 13 are set, it is only during the positive half of the input cycle that an ouput signal can be produced via the AND gate 17 through the OR gate 15. During the negative portion of the input pulse, the AND gate 17 is disabled and, since the B flip-flop is set, neither input to the OR gate 15 is activated. The next positive excursion of the input signal acts to trigger the flip-flop A to the reset condition which disables the AND gate 17. The input signal, however, is coupled directly to the AND gate and the resetting of the A flip-flop 11 is delayed intrinsically so that the output of the AND gate 17 is momentarily activated during the delay before the set output signal from the A flip-flop 11 goes low. The width of the resulting spurious output signal is equal approximately to the delay time between the clock input and the change in the output signals from the A flip-flop 11. Various delays might be inserted at the input to the AND gate 17 but they tend to skew the symmetry of the output signal and must be matched to the delay characteristics of the A flip-flop. Even then, a transient can occur due to the finite rise and fall times of the signals.

Figure 2:
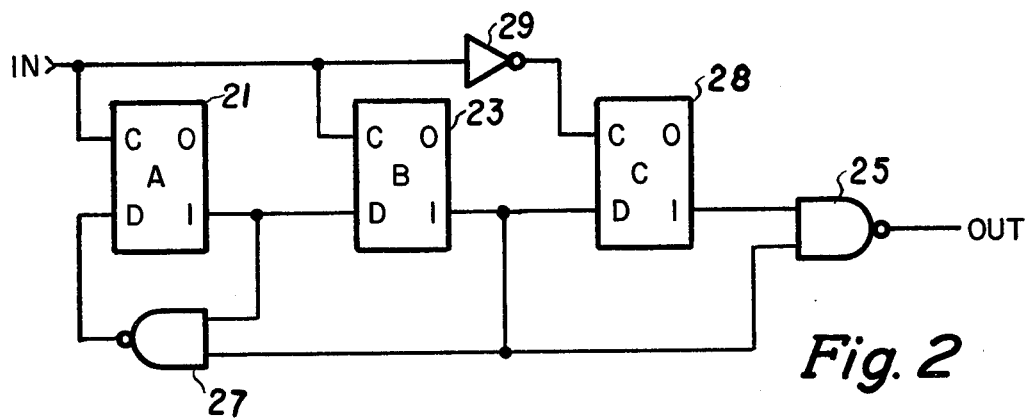
FIG. 2 is a logic circuit illustrating one embodiment of the invention.

The circuit of the invention as shown in FIG. 2 avoids the transient problem by the addition of a third flip-flop. The flip-flops 21 and 23 operate in a manner similar to the flip-flops 11 and 13 in FIG. 1. That is, the contents of the A flip-flop 21 are shifted into the B flip-flop 23 by each input signal pulse. When both the A flip-flop 21 and the B flip-flop 23 are set, a zero is shifted into the A flip-flop 21 by the action of a NAND gate 27 which produces a zero output signal when both inputs are activated. The third flip-flop 28 is clocked 180° out of phase with the input signal by the action of an inverter 29. During the negative portion of the input signal, the contents of the B flip-flop 23 are gated into the C flip-flop 28. A NAND gate 25 produces an output signal according to the contents of the B flip-flop 23 and the C flip-flop 28.

Figure 3:
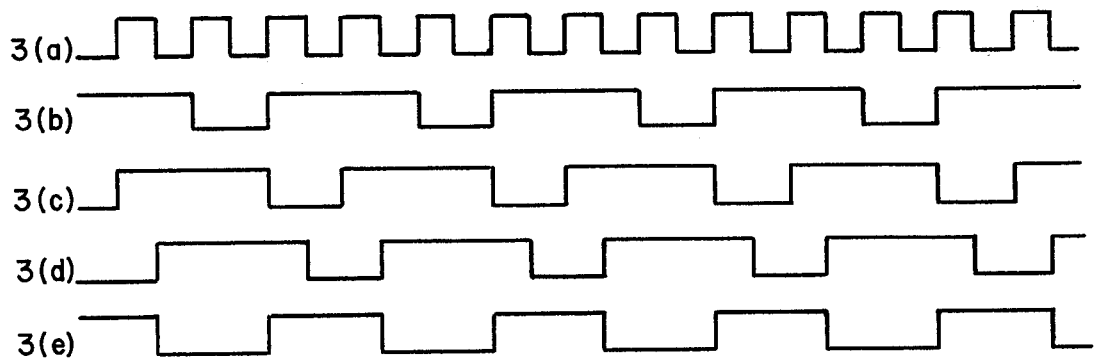
FIG. 3 is a timing diagram showing the time relations of the signals at various points in the circuit of FIG. 2.

The timing diagrams of FIG. 3 illustrate the operations of the circuit embodiment shown in FIG. 2. FIG. 3(a) is an idealized waveform of the input signal frequency. FIG. 3(b) is an idealized waveform of the 1 output signal from the flip-flop 21; 3(c), of the 1 output signal from the B flip-flop 23; and 3(d), of the 1 output signal from the C flip-flop 28. FIG. 3(e) is the output signal from the NAND gate 25.

The first three figures, 3(a)–3(c), apply to the circuit of FIG. 1 as well as to the circuit of FIG. 2. The addition of the flip-flop C, whose timing is shown in FIG.

3(d), removes the input signal from the output gating. By using the inverted input signal to contol the C flip-flop 28, the requirement of using a timing signal as a control on the output gating is avoided. Therefore, the circuit of the invention produces an odd modulus, substantially symmetrical count without transients by isolating the input signal from the output gating.

The suppression of transients can be seen by an examination of the circuit of FIG. 2 in connection with the timing diagram of FIG. 3. The output signal is a function of the B flip-flop 23 and the C flip-flop 28 via the gate 25. FIGS. 3(c) and 3(d), showing the output waveforms of the two flip-flops, reveals that the changes in the two flip-flops are spaced at least a half cycle apart so that no transitions occur at the same time. This prevents transients in the output signal. A comparison of FIGS. 3(b) and 3(c), the signals of the flip-flops indicates that the output signal of the A flip-flop 11 and the B flip-flop 13 in FIG. 1 have a common transition edge with each other and with the timing signals. The common transition times between the input signal and the flip-flops of FIG. 2 is not a problem since the output signal does not depend directly on the input signal.

The general rule for constructing a divide by $m$ circuit, where $m$ is an odd modulus, according to the invention is as follows. The number of stages (flip-flops) required is given by $n$ where $n = (m+3)/2$. The stages are coupled as a standard shift register except that the last stage is clocked by the inverted input signal. The input signal to the first stage is the NAND function of the stages $n$-2 and $n$-1, i.e., the penultimate and antepenultimate stages. The output signal is the AND function (including NAND) of the stages $n$-1 and $n$, i.e., the ultimate and penultimate stages.

The NANd input function to the input of the first stage is understood to include variations in the circuits of other than D-type flip-flops where the NAND function is implicit. For example, if the stages are comprised of clocked JK-type flip-flops, the J-input signal to the first stage will be the complement of the output signal from the antepenultimate stage, i.e., $J_A = \overline{Q}_{n-2}$. The K-input signal to the first stage will be the output signal from the penultimate stage, i.e., $K_A = Q_{n-1}$.

To show how the above connections perform the NAND function, the following sequence of inputs will be interpreted in terms of the effect on the first flip-flop. The sequence that will be followed by $Q_{n-2}$ and $Q_{n-1}$ will be, in terms of logical signals: $Q_{n-2} = Q_{n-1} = 0$; $Q_{n-2} = 1$ and $Q_{n-1} = 0$; $Q_{n-2} = Q_{n-1} = 1$; $Q_{n-2} = 0$ and $Q_{n-1} = 1$; and back to $Q_{n-2} = Q_{n-1} = 0$. The above sequence is due to the shift register connection of the stages. In terms of the signals to the first flip-flop, the sequence followed is: (1) $\overline{Q}_{n-2} = 1$ and $Q_{n-1} = 0$ so that $J_A = 1$ and $K = 0$; (2) $\overline{Q}_{n-2} = Q_{n-1} = 0$ so that $J_A = K_A = 0$; (3) $\overline{Q}_{n-2} = 0$ and $Q_{n-1} = 1$ and that $J_A = 0$ and $K_A = 1$; and (4) $\overline{Q}_{n-2} = Q_{n-1} = 1$ so that $J_A = K_A = 1$. In case (1), the flip-flop will be set; in case (2), it will not change so it will remain set; in case (3), it will be reset; and in case (4), it will be toggled from the reset to the set condition. Therefore, the only time the flip-flop will be reset is case (3) in which $\overline{Q}_{n-2} = 0$ and $Q_{n-1} = 1$ or $Q_{n-2} = Q_{n-1} = 1$. That is, for $D_A = 0$ (input signal for a D-type flip-flop), $D_A = Q_{n-2} \cdot Q_{n-1}$ which is the same NAND function to reset the JK-type flip-flop as shown above.

Various modifications to the circuits described and illustrated to explain the concepts and modes of practicing the invention might be made by those of ordinary skill in the art within the principle or scope of the invention as expressed in the appended claims.

I claim:

1. A circuit for symmetrically dividing by an odd modulus $m$ comprising
   $n$ flip-flop means for storing signals, where $n = (m+3)/2$;
   a source of input pulses to be divided;
   complementing means for complementing said input pulses;
   first coupling means for controlling the first $(n - 1)$ flip-flop means with said input pulses;
   second coupling means for controlling the $n$th flip-flop means with said complemented input pulses;
   means for coupling the signal stored in the $i$-th flip-flop means to the $j$-th flip-flop means for storage, where $i = 1, 2, \ldots, n-1$ and $j = 2, 3, \ldots, n$;
   first gating means responsive to the signals stored in the $(n-1)$th and $(n-2)$th flip-flop means for producing a signal which is stored in the first flip-flop means by each input pulse; and
   second gating means responsive to the signals stored in the $n$th and $(n-1)$th flip-flop means for producing an output signal.

2. A logic circuit for symmetrically dividing an input signal by three comprising the combination:
   source of input signals to be divided;
   first and second flip-flop means responsive to the input signals for storing a signal between input signals equivalent to the value of an applied second signal at the leading edge of the input signal;
   third flip-flop means responsive to a 180° phase shift of the input signal for storing a signal between shifted input signals equivalent to the value of an applied second signal at the leading edge of the shifted input signal;
   means for coupling the stored signal in said first flip-flop means as the applied second signal to said second flip-flop means;
   means for coupling the stored signal in said second flip-flop means as the applied second signal to said third flip-flop means;
   first gating means responsive to the stored signals of said first and second flip-flop means for providing an applied second signal to said first flip-flop means; and
   second gating means responsive to the signals stored in said second and third flip-flop means for producing an output signal.

3. The invention as claimed in claim 2 wherein said first gating means is a NAND gate.

* * * * *